(12) United States Patent
Kim et al.

(10) Patent No.: US 12,161,041 B2
(45) Date of Patent: Dec. 3, 2024

(54) ETCHING DEVICE AND METHOD OF MANUFACTURING DISPLAY DEVICE USING THE SAME

(71) Applicant: Samsung Display Co., LTD., Yongin-si (KR)

(72) Inventors: Dae Soo Kim, Seoul (KR); Sang Gab Kim, Seoul (KR); Yun Jong Yeo, Hwaseong-si (KR); Ju Hee Lee, Hwaseong-si (KR); Soo Beom Jo, Incheon (KR); Dae Won Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 858 days.

(21) Appl. No.: 17/308,671

(22) Filed: May 5, 2021

(65) Prior Publication Data

US 2022/0085341 A1     Mar. 17, 2022

(30) Foreign Application Priority Data

Sep. 16, 2020    (KR) .................. 10-2020-0119184

(51) Int. Cl.
*H10K 71/00*      (2023.01)
*H01J 37/32*      (2006.01)
(Continued)

(52) U.S. Cl.
CPC ............ *H10K 71/00* (2023.02); *H01J 37/321* (2013.01); *H01J 37/32449* (2013.01); *H01J 37/32715* (2013.01); *H10K 59/12* (2023.02); *H10K 71/231* (2023.02); *H01J 2237/2007* (2013.01); *H01J 2237/334* (2013.01)

(58) Field of Classification Search
CPC ...... H10K 71/00; H10K 59/12; H10K 71/231; H10K 59/1213; H10K 71/60; H10K 59/1201; H10K 71/621; H01J 37/321; H01J 37/32449; H01J 37/32715; H01J 2237/2007; H01J 2237/334; H01J 37/3244; H01L 27/1259
See application file for complete search history.

(56) References Cited

U.S. PATENT DOCUMENTS 7,413,993 B2    8/2008   Gottzein et al.
9,685,346 B2    6/2017   Kim et al.
(Continued)

FOREIGN PATENT DOCUMENTS

JP     2005-72371     3/2005
JP     2006-148122    6/2006
(Continued)

*Primary Examiner* — Renan Luque
(74) *Attorney, Agent, or Firm* — KILE PARK REED & HOUTTEMAN PLLC

(57) ABSTRACT

An etching device includes a chamber; a stage disposed in the chamber and on which a target substrate is loaded; a gas distribution unit disposed to face the stage in the chamber; a plurality of plasma generation modules disposed above the chamber; a gas supply unit that supplies gas into the chamber; a gas line connecting the gas supply unit and the plurality of plasma generation modules; and a plurality of gas inlet pipes each including an end connected to the plasma generation module and another end connected to the gas distribution unit.

18 Claims, 13 Drawing Sheets

(51) Int. Cl.
*H10K 59/12* (2023.01)
*H10K 71/20* (2023.01)

(56) References Cited

U.S. PATENT DOCUMENTS

| | | | |
|---|---|---|---|
| 9,859,145 | B2 | 1/2018 | Fischer et al. |
| 9,966,274 | B2 | 5/2018 | Kim et al. |
| 10,622,193 | B2 | 4/2020 | Burgess et al. |
| 11,127,568 | B2 | 9/2021 | Burgess et al. |
| 2016/0186315 | A1* | 6/2016 | Chi .................. H01J 37/32357 204/192.12 |
| 2016/0293732 | A1* | 10/2016 | Kurata ................ H01L 27/1248 |

FOREIGN PATENT DOCUMENTS

| | | |
|---|---|---|
| KR | 10-2005-0080433 | 8/2005 |
| KR | 10-2009-0011410 | 2/2009 |
| KR | 10-2010-0078334 | 7/2010 |
| KR | 10-1341711 | 12/2013 |
| KR | 10-2015-0009940 | 1/2015 |
| KR | 10-2015-0065025 | 6/2015 |
| KR | 2016-0008367 | 1/2016 |
| KR | 10-2016-0062730 | 6/2016 |
| KR | 10-2018-0124705 | 11/2018 |
| KR | 10-2022860 | 9/2019 |
| KR | 10-2020-0021000 | 2/2020 |

\* cited by examiner

TFT: 105, SE, DE, GE
120: GE, CE1
130: CE2
140: SE, DE, ELVDDE
150: DL, CNE, ELVDDL

ETCHING DEVICE AND METHOD OF MANUFACTURING DISPLAY DEVICE USING THE SAME

CROSS-REFERENCE TO RELATED APPLICATION(S)

This application claims priority to and the benefit of Korean Patent Application No. 10-2020-0119184 under 35 U.S.C. § 119, filed on Sep. 16, 2020 in the Korean Intellectual Property Office (KIPO), the contents of which are incorporated herein by reference.

BACKGROUND

1. Technical Field

The disclosure relates to an etching device and a method of manufacturing a display device using the same.

2. Description of the Related Art

The importance of display devices is increasing with the development of multimedia. In response to this, various types of display devices such as liquid crystal display (LCD) devices and organic light-emitting display (OLED) devices have been used.

In order to manufacture the above-described display devices, a deposition process, an etching process, an ashing process, or the like using plasma may be performed. For example, the deposition process, the etching process, the ashing process, or the like using plasma may be applied to remove corrosion that may occur during a manufacturing process of the display device.

In the above processes, gas in a plasma state or a gaseous state may be introduced into a chamber. In this case, it is important that the gas is uniformly diffused in the chamber, in which the above-described processes are performed, in order to achieve process uniformity.

SUMMARY

Aspects of the disclosure provide an etching device capable of removing corrosion formed on a target substrate.

Aspects of the disclosure also provide an etching device allowing gas to be uniformly diffused into a chamber.

Aspects of the disclosure also provide a method of manufacturing a display device using the etching device.

It should be noted that objects of the disclosure are not limited to the above-described objects, and other objects of the disclosure will be apparent to those skilled in the art from the following descriptions.

An embodiment of etching device may include a chamber; a stage disposed in the chamber and on which a target substrate is loaded; a gas distribution unit disposed to face the stage in the chamber; a plurality of plasma generation modules disposed above the chamber; a gas supply unit that supplies gas into the chamber; a gas line connecting the gas supply unit and the plurality of plasma generation modules; and a plurality of gas inlet pipes each including an end connected to the plasma generation module and another end connected to the gas distribution unit.

The plurality of plasma generation modules may include a first plasma generation module spaced apart from an edge of an upper surface of the chamber by a first distance in a plan view, and a plurality of second plasma generation modules spaced apart from the edge of the upper surface of the chamber by a second distance in a plan view. The second distance may be less than the first distance.

The first plasma generation module may be disposed in a center of the upper surface of the chamber in a plan view.

The first plasma generation module and the plurality of second plasma generation modules may be arranged in a first direction on the upper surface of the chamber.

The plurality of second plasma generation modules may be disposed at corner areas of the upper surface of the chamber, respectively.

The etching device may be selectively switched to a first operation mode in which the plurality of plasma generation modules are turned off or a second operation mode in which the plurality of plasma generation modules are turned on.

In the first operation mode, the gas in a gaseous state supplied from the gas supply unit may be through the plurality of plasma generation modules and may be introduced into the chamber as it is, and in the second operation mode, the plurality of plasma generation modules may be turned on, and the gas in the gaseous state supplied from the gas supply unit may be excited to a plasma state by the plurality of plasma generation modules and introduced into the chamber.

The plurality of plasma generation modules may be disposed on an upper surface of the chamber to be spaced apart from each other by a third distance, and the third distance may be less than or equal to twice a diffusion distance of the gas during a first time in the chamber.

The first time may be a time during which the gas converted into a plasma state by the plurality of plasma generation modules is maintained in the plasma state in the chamber.

The etching device may further include a power supply unit that supplies power to at least one of the plurality of plasma generation modules, the stage, and the gas distribution unit. The first time may be a time from when the target substrate is loaded on the stage until the power supply unit supplies the power.

The stage may include an electrostatic chuck, and the electrostatic chuck may be turned on after the first time has passed from when the target substrate is loaded on the electrostatic chuck.

The power supply unit may include an RF (radio frequency) power supply that supplies energy to excite the gas passing through the gas distribution unit to a plasma state.

The RF power supply may be electrically connected to the stage.

The RF power supply may be electrically connected to the gas distribution unit.

The gas distribution unit may include an induction coil.

The target substrate may include a base layer and a metal layer disposed on the base layer, impurities may be disposed on the metal layer, and the impurities may be etched by the gas excited to a plasma state.

The metal layer may include aluminum, and the impurities may be aluminum oxide.

An embodiment of a method of manufacturing a display device may include loading a target substrate onto a stage in a chamber, and injecting gas, which has passed through a plurality of plasma generation modules disposed in an upper portion of the chamber, onto the target substrate to etch the target substrate.

The method may further include diffusing the gas by injecting the gas into a center portion of a gas distribution unit disposed above the stage and a space between the center portion of the gas distribution unit and an edge of the gas distribution unit.

The method may further include switching an operation mode of an etching device to a first operation mode in which the plurality of plasma generation modules are turned off and the gas in a gaseous state introduced from the outside is excited to a plasma state in the chamber, or a second operation mode in which the plurality of plasma generation modules are turned on to excite the gas in the gaseous state passing through the plurality of plasma generation modules to the plasma state.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

The disclosure will now be described more fully hereinafter with reference to the accompanying drawings, in which some embodiments of the disclosure are shown. This disclosure may, however, be embodied in different forms and should not be construed as being limited to the embodiments set forth herein. Rather, these embodiments are provided so that this disclosure will be thorough and complete, and will convey the teachings of the disclosure to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments will be described with reference to the accompanying drawings.

Figure 1:
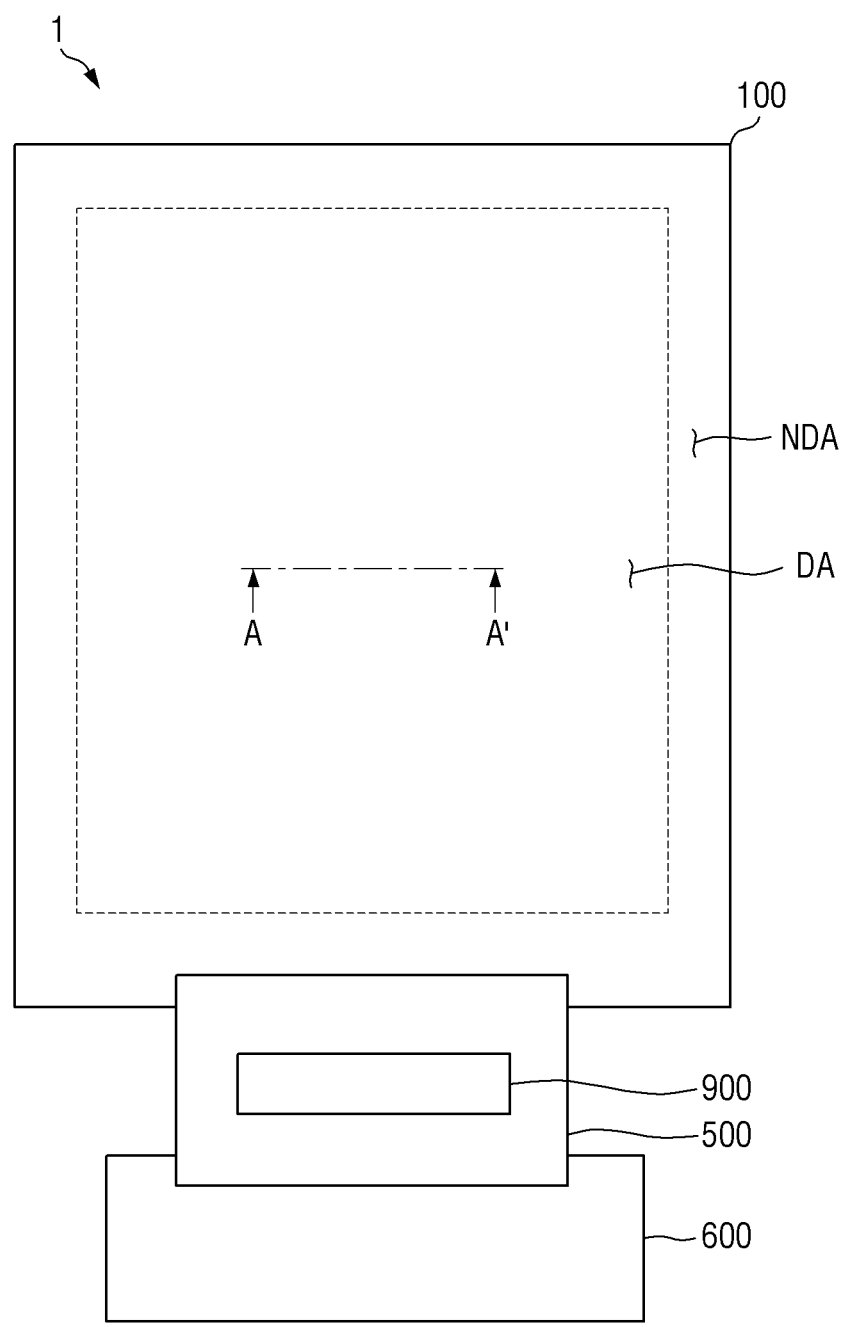
FIG. 1 is a schematic plan view of a display device related to an etching device according to an embodiment.
Figure 2:
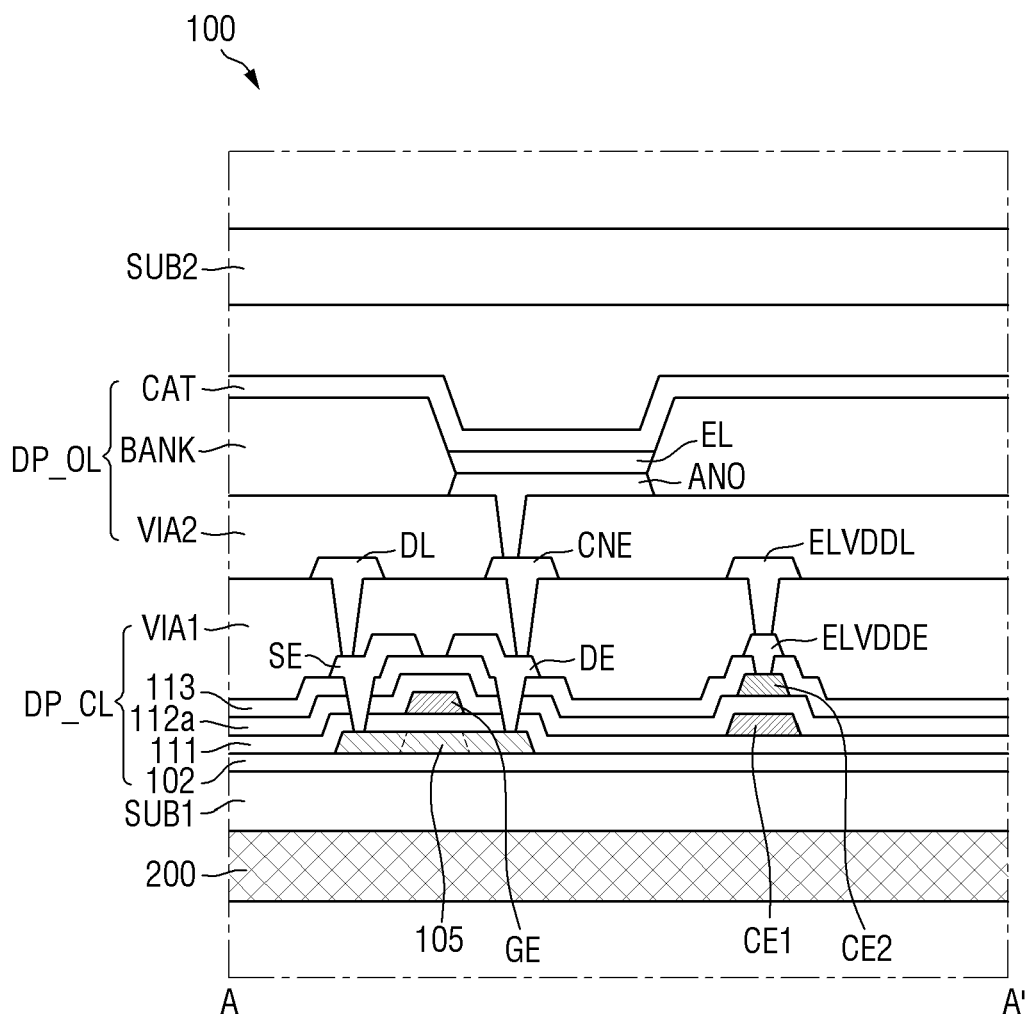
FIG. 2 is a schematic cross-sectional view of a display panel of FIG. 1 along line A-A' of FIG. 1.
Figure 3:
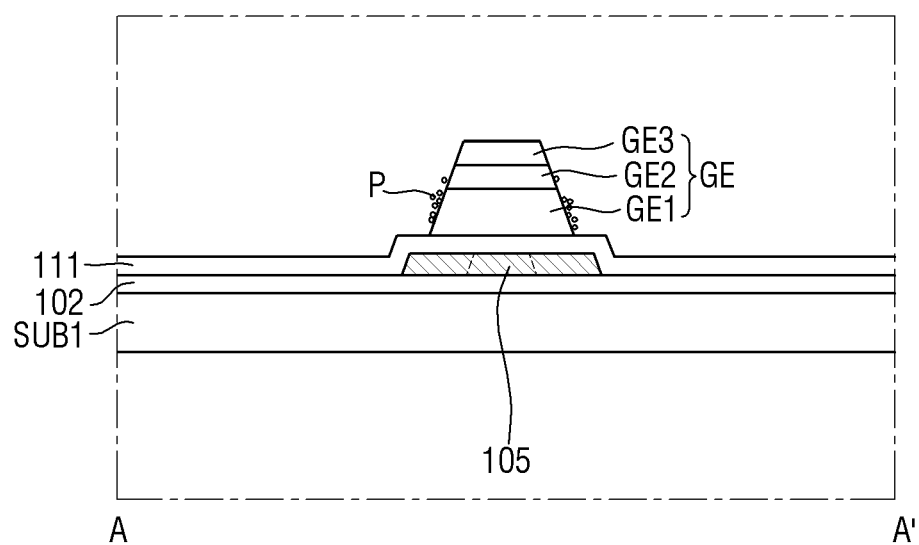
FIG. 3 is a schematic cross-sectional view illustrating impurities formed on a gate electrode during a manufacturing process of the display panel of FIG. 1 along line A-A' of FIG. 1.

FIG. 1 is a schematic plan view of a display device related to an etching device according to an embodiment. FIG. 2 is a schematic cross-sectional view of a display panel of FIG. 1. FIG. 3 is a schematic cross-sectional view illustrating impurities formed on a gate electrode during a manufacturing process of the display panel of FIG. 1.

Referring to FIG. 1, a display device 1 may be a device for displaying a video or a still image. The display device 1 may include various kinds of products such as a television, a laptop computer, a monitor, digital signage, and an Internet of Things (IoT) device, as well as portable electronic devices such as a mobile phone, a smartphone, a tablet personal computer (PC), a smart watch, a watch phone, a mobile communication terminal, an electronic notebook, an e-book reader, a portable multimedia player (PMP), a navigation device, and an ultra-mobile PC (UMPC).

The display device 1 may include a display panel 100 configured to display an image, a printed circuit board 500 connected to the display panel 100, a main circuit board 600 connected to the printed circuit board 500, and a driving integrated circuit 900 mounted on the printed circuit board 500.

For example, an organic light-emitting display panel may be used as the display panel 100. In the following embodiments, an organic light-emitting display panel is used as the display panel 100, but the disclosure is not limited thereto, and other types of display panels such as a liquid crystal display (LCD), a quantum dot organic light-emitting display panel (QD-OLED), a quantum dot LCD (QD-LCD), a quantum nano light-emitting display panel (a nano-emissive display (NED), a micro light-emitting diode (LED), and the like may be used as the display panel 100.

The display panel 100 may include a display area DA including pixel areas and a non-display area NDA disposed adjacent to or around the display area DA.

The display area DA may have a rectangular shape in which each corner has a right angle in a plan view or a rectangular shape in which each corner is round in a plan view. The display area DA may have short sides and long sides. The short sides of the display area DA may extend in one direction (e.g., a horizontal direction in FIG. 1). The long sides of the display area DA may extend in the other direction (e.g., a vertical direction in FIG. 1) intersecting the one direction. However, a planar shape of the display area DA is not limited to the rectangular shape, and the display area DA may have various shapes such as a circular shape, an elliptical shape, or the like. The non-display area NDA may be disposed adjacent to short sides and long sides of the display area DA. In this case, the non-display area NDA may surround all sides of the display area DA and form an edge of the display area DA. However, the non-display area NDA is not limited thereto and may be disposed adjacent to only the short sides or only the long sides of the display area DA. In some embodiments, in the display panel 100, both corner portions adjacent to a portion to which the printed circuit board 500 is connected may be cut in an "L" shape so that a width of the portion in the one direction to which the printed circuit board 500 is connected is reduced.

The printed circuit board 500 may be attached to the non-display area NDA at a lower end of the display panel 100. One side of the printed circuit board 500 may be attached to the display panel 100, and the other side of the printed circuit board 500 may be attached to the main circuit board 600. The printed circuit board 500 may electrically connect the display panel 100 and the main circuit board 600. In some embodiments, the printed circuit board 500 may be bent in a thickness direction such that a portion thereof overlaps the display panel 100.

The main circuit board 600 may be attached to the printed circuit board 500. The main circuit board 600 may include a circuit pad area electrically connected to the printed circuit board 500.

The driving integrated circuit 900 may be mounted on the printed circuit board 500 and drive a pixel circuit of the display panel 100. The one side of the printed circuit board 500 may be a lower side of the display panel 100, which extends in the one direction. The driving integrated circuit 900 may be, for example, a chip-on-film (COF). In some embodiments, the driving integrated circuit 900 may be a chip-on-plastic (COP) or a chip-on-glass (COG).

With further reference to FIG. 2, the display panel 100 may include a first substrate SUB1, a circuit element layer DP_CL formed on the first substrate SUB1, a display element layer DP_OL formed on the circuit element layer DP_CL and a second substrate SUB2 formed on the display element layer DP_OL. The display panel 100 may further include functional layers such as a touch layer, an anti-reflection layer, a refractive index adjusting layer, and the like. In some embodiments, the second substrate SUB2 may be omitted, and the display panel 100 may further include a thin film encapsulation layer configured to encapsulate the circuit element layer DP_CL and the display element layer DP_OL. In some embodiments, the display panel 100 may further include a sealing member interposed between the edge portion of the first substrate SUB1 and the edge portion of the second substrate SUB2 to seal the space between the first substrate SUB1 and the second substrate SUB2.

The first substrate SUB1 and the second substrate SUB2 may be disposed to face each other. The circuit element layer DP_CL and the display element layer DP_OL may be interposed between the first substrate SUB1 and the second substrate SUB2. The first substrate SUB1 and the second substrate SUB2 may be rigid substrates including a rigid material such as flexible glass, quartz, or the like. However, the first substrate SUB1 and the second substrate SUB2 are not limited thereto and may be flexible substrates including a flexible material such as polyimide (PI).

The circuit element layer DP_CL may include at least one intermediate insulating layer and a circuit element. The circuit element layer DP_CL may include a thin film transistor.

The display element layer DP_OL may include a self-emissive element. For example, the self-emissive element may be an organic light-emitting element.

The circuit element layer DP_CL may include a buffer layer 102, a semiconductor layer 105, a first insulating layer 111, a first conductive layer 120, a second insulating layer 112a, a second conductive layer 130, a third insulating layer 113, a third conductive layer 140, a first via layer VIA1, and a fourth conductive layer 150. The display element layer DP_OL may include a second via layer VIA2, an anode ANO, a bank layer BANK, an organic layer EL, and a cathode CAT.

The buffer layer 102 may be disposed on the first substrate SUB1. The buffer layer 102 may prevent moisture and oxygen from penetrating from the outside through the first substrate SUB1. The buffer layer 102 may include one of a silicon nitride ($SiN_x$) film, a silicon oxide ($SiO_2$) film, and an oxynitride ($SiO_xN_y$) film.

The semiconductor layer 105 may be disposed on the buffer layer 102. The semiconductor layer 105 may form a channel of a thin film transistor. The semiconductor layer 105 may be disposed in each pixel of the display area DA and may be disposed even in the non-display area NDA in some cases. The semiconductor layer 105 may include a source/drain area and an active area. The semiconductor layer 105 may include polycrystalline silicon.

The first insulating layer 111 may be disposed on the semiconductor layer 105. The first insulating layer 111 may be disposed over an entire surface of the first substrate SUB1. The first insulating layer 111 may be a gate insulating film having a gate insulating function. The first insulating layer 111 may include a silicon compound, a metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. The above materials may be used alone or in combination.

The first conductive layer 120 may be disposed on the first insulating layer 111. The first conductive layer 120 may include a gate electrode GE of a thin film transistor TFT, a first electrode CE1 of a storage capacitor, and a gate signal line.

The first conductive layer 120 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a stacked film made of a material selected from the above-exemplified materials.

The second insulating layer 112a may be disposed on the first conductive layer 120. The second insulating layer 112a may insulate the first conductive layer 120 and the second conductive layer 130 from each other. The second insulating layer 112a may be made of a material selected from the above-exemplified materials of the first insulating layer 111.

The second conductive layer 130 may be disposed on the second insulating layer 112a. The second conductive layer 130 may include a second electrode CE2 of the storage capacitor. A material of the second conductive layer 130 may be selected from the above-exemplified materials of the first conductive layer 120. The first electrode CE1 and the second electrode CE2 may form the storage capacitor through the second insulating layer 112a.

The third insulating layer 113 may be disposed on the second conductive layer 130. The third insulating layer 113 may include at least one of the above-exemplified materials of the first insulating layer 111. In some embodiments, the third insulating layer 113 may include an organic insulating material. The organic insulating material may be selected from materials of the first via layer VIA1, which will be described below.

The third conductive layer 140 may be disposed on the third insulating layer 113. The third conductive layer 140 may include a source electrode SE, a drain electrode DE, and a high-potential voltage electrode ELVDDE. The third conductive layer 140 may include at least one selected from among Mo, Al, Pt, Pd, Ag, Mg, Au, Ni, Nd, Ir, Cr, Ca, Ti, Ta, W, and Cu. The third conductive layer 140 may be a single film made of (or including) a material selected from the above-exemplified materials. The third conductive layer 140 is not limited thereto and may be a stacked film. For example, the third conductive layer 140 may be formed in a stacked structure of Ti/Al/Ti, Mo/Al/Mo, Mo/AlGe/Mo, Ti/Cu, or the like. In an embodiment, the third conductive layer 140 may be formed in a stacked structure of Ti/Al/Ti.

The first via layer VIA1 may be disposed on the third conductive layer 140. The first via layer VIA1 may include an organic insulating material. The organic insulating material may include at least one among an acrylic-based resin (polyacrylate resin), an epoxy resin, a phenolic resin, a polyamide-based resin, a polyimide-based resin, an unsaturated polyester-based resin, a polyphenylene-based resin, a polyphenylenesulfide-based resin, or benzocyclobutene (BCB).

The fourth conductive layer 150 may be disposed on the first via layer VIA1. The fourth conductive layer 150 may include a data line DL, a connection electrode CNE, and a high-potential voltage line ELVDDL. The data line DL may be electrically connected to the source electrode SE of the thin film transistor TFT through a contact hole passing through the first via layer VIA1. The connection electrode CNE may be electrically connected to the drain electrode DE of the thin film transistor TFT through a contact hole passing through the first via layer VIA1. The high-potential voltage line FT VDDL may be electrically connected to the high-potential voltage electrode FT VDDE through a contact hole passing through the first via layer VIA1 The fourth conductive layer 150 may include a material selected from the materials of the third conductive layer 140.

The second via layer VIA2 may be disposed on the fourth conductive layer 150. The second via layer VIA2 may include at least one of the above-exemplified materials of the first via layer VIA1.

The anode ANO may be disposed on the second via layer VIA2. The anode ANO may be electrically connected to the connection electrode CNE through a contact hole passing through the second via layer VIA2.

The bank layer BANK may be disposed on the anode ANO. The bank layer BANK may include a contact hole which exposes the anode ANO. The bank layer BANK may be made of an organic insulating material or an inorganic insulating material. For example, the bank layer BANK may include at least one of a photoresist, a polyimide-based resin, an acrylic-based resin, a silicone compound, a polyacrylic-based resin, and the like.

The organic layer EL may be disposed on an upper surface of the anode ANO and in an opening of the bank layer BANK.

The cathode CAT may be disposed on the organic layer FT and the bank layer BANK. The cathode CAT may be a common electrode disposed over pixels.

With further reference to FIG. 3, during the manufacturing process of the display panel 100, impurities P may be formed on the gate electrode GE.

In more detail, the gate electrode GE may include at least one layer made of a metal. For example, the gate electrode GE may include a first gate layer GE1 formed on the first insulating layer 111, a second gate layer GE2 formed on the first gate layer GE1, and a third gate layer GE3 formed on the second gate layer GE2. In this case, the first gate layer GE1 may include aluminum or an alloy including the same, the second gate layer GE2 may include titanium nitride, and the third gate layer GE3 may include titanium.

The display device 1 may further include a cover panel 200 disposed on the first substrate SUB1. The circuit element layer DP_CL and the display element layer DP_OL may be disposed on one surface of the first substrate SUB1 facing the second substrate SUB2. The cover panel 200 may be disposed on the other surface of the first substrate SUB1 opposite to one surface of the first substrate SUB1. The cover panel 200 may include at least one functional layer. The functional layer may be a layer that performs a heat dissipation function, an electromagnetic wave shielding function, a grounding function, a buffer function, a strength reinforcing function, a support function, and/or a digitizing function.

During the manufacturing process of the display panel 100, the gate electrode GE may be exposed to the outside before another layer, for example, the second insulating layer 112a, is formed on the gate electrode GE. In this case, corrosion may occur in the first gate layer GE1 and thus the impurities P may be formed on a surface of the first gate layer GE1. The impurities P may include a metal oxide. The impurities P may be, for example, aluminum oxide.

In an etching process for removing the impurities P, an etching device 10 described below may be used. However, an example in which the etching device 10 is applied is not limited to the above example. For example, the etching device 10 described below may also be used in an ashing process for removing a photoresist that is used in a mask process.

In FIG. 3, the first gate layer GE1 is illustrated as a layer on which the impurities P are formed, but the disclosure is not limited thereto. The layer on which the impurities P are formed may include the first gate layer GE1, and/or other layers in which corrosion may occur during the process, for example, the second gate layer GE2, the third gate layer GE3, the first electrode CE1, the second electrode CE2, the source electrode SE, the drain electrode DE, the high-potential voltage electrode FT VDDE, the data line DL, the connection electrode CNE, the high-potential voltage line ELVDDL, the anode ANO, and the cathode CAT.

Figure 4:
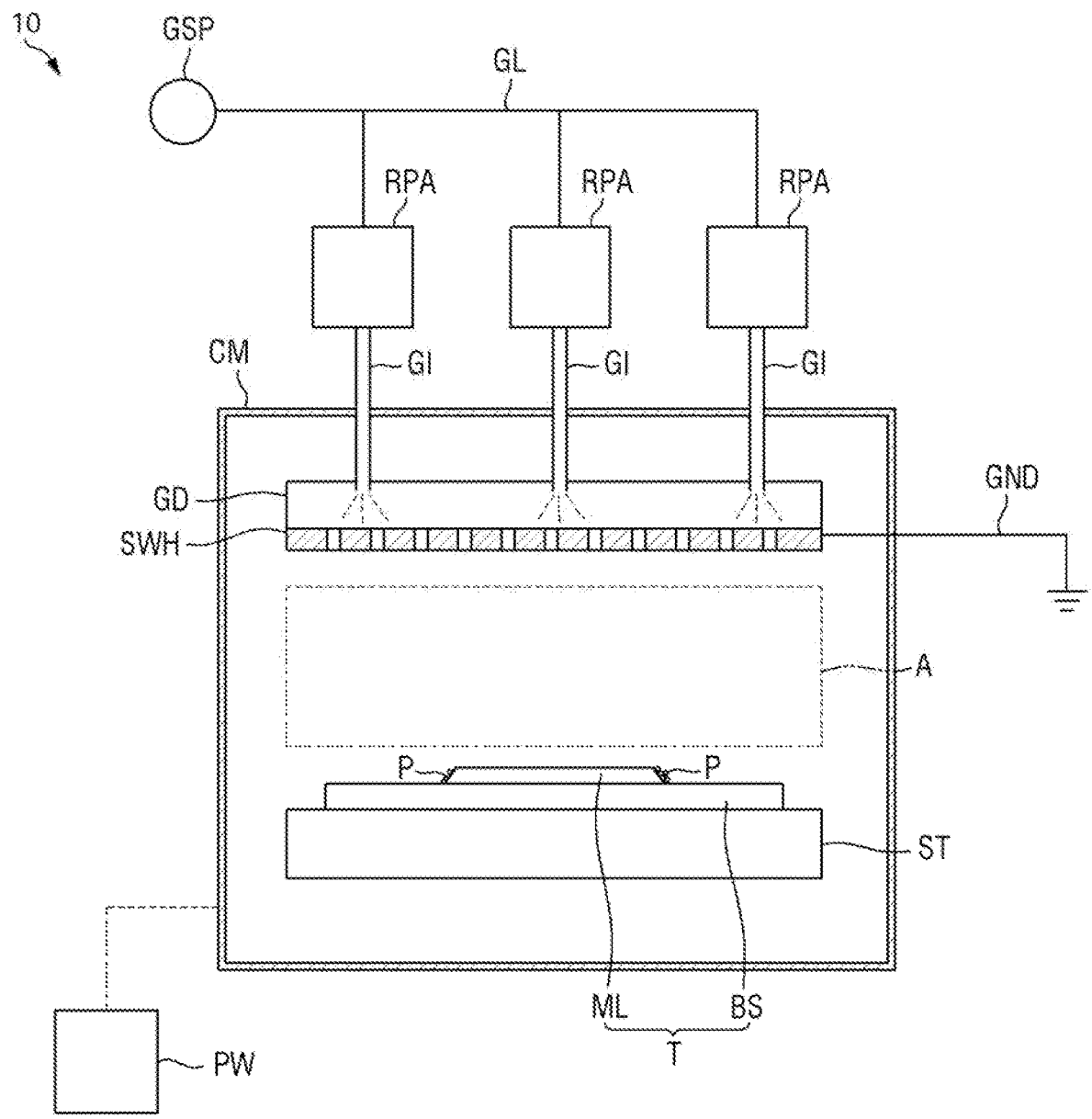
FIG. 4 is a schematic cross-sectional view of the etching device according to an embodiment.
Figure 5:
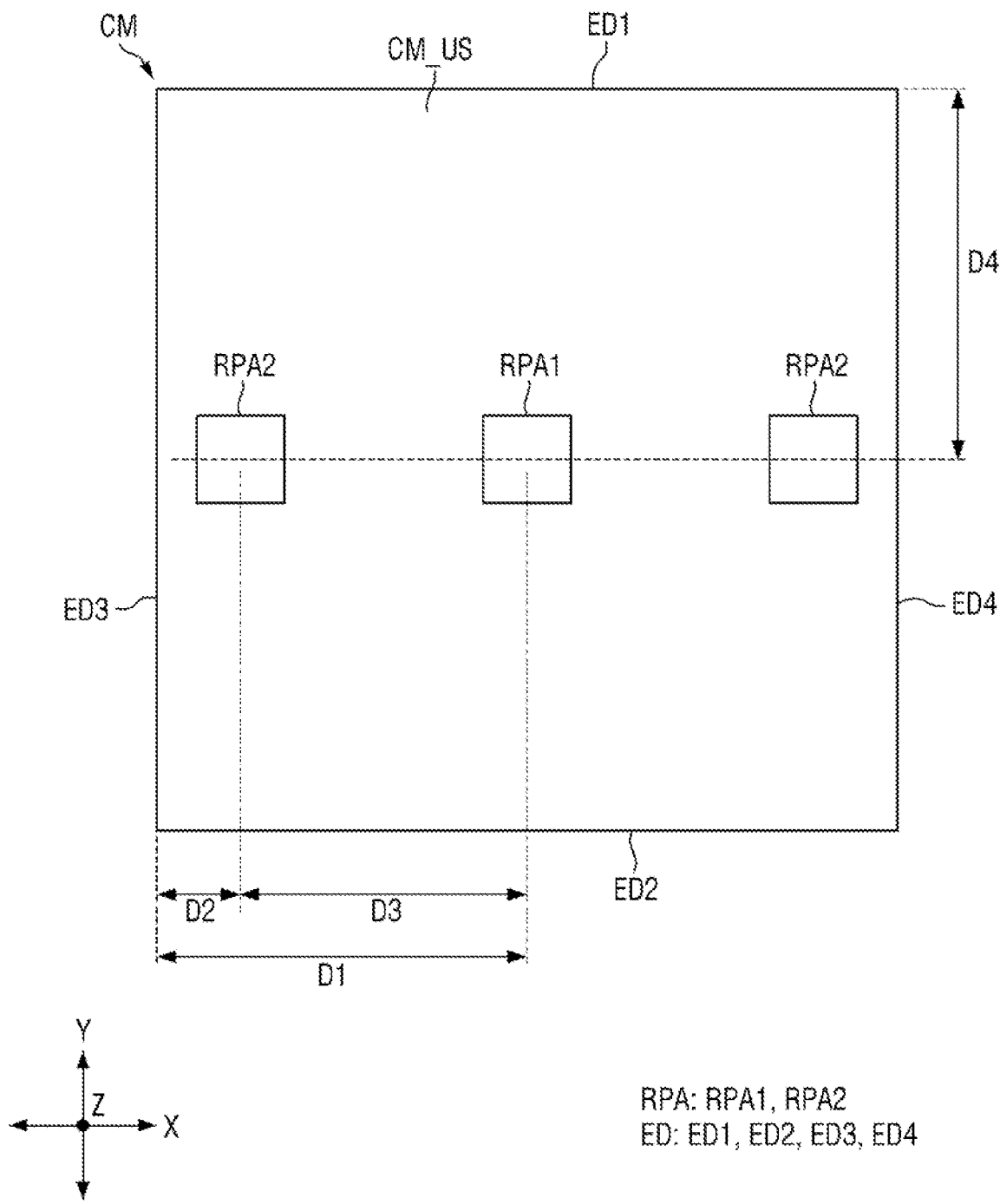
FIG. 5 is a schematic plan view illustrating an arrangement of plasma generation modules of the etching device according to an embodiment.

FIG. 4 is a schematic cross-sectional view of an etching device according to an embodiment. FIG. 5 is a schematic plan view illustrating an arrangement of plasma generation modules of the etching device according to an embodiment.

Referring to FIG. 4, the etching device 10 may include a chamber CM, a stage ST, a gas distribution unit GD, plasma generation modules RPA, a gas supply unit GSP, a gas line GL, gas inlet pipes GI, and a power supply unit PW.

The chamber CM may provide a space in which the etching process is performed. The chamber CM may be sealed from the outside. Gas may be supplied into the chamber CM through the gas inlet pipes GI, which will be described below. Although not shown in the drawing, the chamber CM may include at least one outlet through which the gas therein is discharged. In an embodiment, the chamber CM may have a rectangular parallelepiped shape, but the shape of the chamber CM is not limited thereto.

The stage ST may be disposed in an interior of the chamber CM. A target substrate T may be loaded onto the stage ST. In an embodiment, the stage ST may be disposed at a lower end of the chamber CM to face the gas distribution unit GD. The stage ST may fix the target substrate T. For example, the stage ST may include an electrostatic chuck that affixes the target substrate T to an upper surface of the stage ST. Although not shown in the drawing, in some embodiments, the stage ST may be provided with a lift pin configured to lift the target substrate T from the upper surface of the stage ST to a predetermined height.

The target substrate T may be loaded onto the stage ST.

The target substrate T may include a base layer BS and a metal layer ML formed on the base layer BS.

The metal layer ML may be in a state in which impurities P are formed on a surface thereof. The impurities P may include a metal oxide formed by the corrosion of the metal layer ML. For example, the metal layer ML may include aluminum, and the impurities P may be aluminum oxide.

The base layer BS may include the first substrate SUB1 of FIGS. 1 to 3. The metal layer ML may include at least one of the first gate layer GE1, the second gate layer GE2, the third gate layer GE3, the first electrode CE1, the second electrode CE2, the source electrode SE, the drain electrode DE, the high-potential voltage electrode ELVDDE, the data line DL, the connection electrode CNE, the high-potential voltage line FT VDDL, the anode ANO, and cathode CAT of FIGS. 1 to 3. For example, the base layer BS and the metal layer ML may be the first substrate SUB1 and the first gate layer GE1 of FIGS. 1 to 3, respectively, but the disclosure is not limited thereto.

Radicals of the gas excited to a plasma state in the chamber CM or outside the chamber CM may react with the impurities P of the metal layer ML to remove the impurities P. For example, the target substrate T processed by the etching device 10 may be the display panel 100 of FIGS. 1 to 3. However, the target object of the etching device 10 is not limited to the above example.

The gas distribution unit GD may be disposed in the chamber CM. The gas distribution unit GD may be disposed above the stage ST to face the stage ST. The gas distribution unit GD and the stage ST may be disposed with a reaction area A therebetween.

The gas distribution unit GD may include shower heads SWH each having holes formed therein. The shower heads SWH may distribute the gas, which is introduced into the chamber CM from the gas inlet pipes GI, into the reaction area A. The gas injected into an upper side of each of the shower heads SWH may be diffused into the reaction area A below the shower heads SWH by passing through the holes. In an embodiment, a ground electrode GND configured to electrically ground the gas distribution unit GD may be connected to the gas distribution unit GD.

The plasma generation modules RPA may be disposed outside the chamber CM. The plasma generation modules RPA may be disposed above the chamber CM. The plasma generation modules RPA may excite gas in a gaseous state passing therethrough and convert the gas into a plasma state. The plasma generation module RPA may include a remote plasma source or a remote plasma generator.

The plasma generation modules RPA may operate to pass gas in a gaseous state as it is or to excite the gas in the gaseous state and convert the gas into a plasma state. For example, in case that the plasma generation modules RPA are turned off, the gas supplied from the gas supply unit GSP may be supplied into the interior of the chamber CM through the plasma generation modules RPA while maintaining the gaseous state. In case that the plasma generation modules RPA are turned on, the gas passing through the plasma generation modules RPA may be excited to a plasma state and supplied into the chamber CM. In another example, the plasma generation modules RPA may excite only a portion of gas passing therethrough to a plasma state according to a predetermined ratio.

The gas supply unit GSP may be disposed outside the chamber CM. The gas supply unit GSP may supply gas into the chamber CM. The gas may be supplied through the gas line GL, the plasma generation modules RPA, and the gas inlet pipes GI. The gas may be used in the etching process and/or the ashing process. For example, the gas may be a chlorine-based gas including $Cl_2$, $BCl_3$, $CCl_4$, and $HCl$, or a fluorine-based gas including $C_xH_yF_z$, $C_xF_y$, $NF_3$, and $SF_6$. In another example, the gas may include at least one selected from among $H_2$, $O_2$, $N_2O$, Ar, He, $N_2$, and $H_2O$.

The gas line GL may connect the gas supply unit GSP and the plasma generation modules RPA. The gas supplied by the gas supply unit GSP may be supplied to each of the plasma generation modules RPA through the gas line GL.

The gas inlet pipes GI may connect the plasma generation modules RPA and the chamber CM. The gas inlet pipes GI may extend so that a shortest path is formed in a vertical direction from the plasma generation modules RPA to the gas distribution unit GD. An end of the gas inlet pipe GI may be connected to the plasma generation module and another end thereof may be connected to the gas distribution unit GD in the chamber CM. The another end of the gas inlet pipe GI may be disposed above an upper surface of the shower head SWH. The gas discharged from the another end of the gas inlet pipe GI may be diffused on the upper surface of the shower head SWH.

Since the plasma generation modules RPA and the gas inlet pipes GI are disposed, a sufficient amount of gas may be uniformly diffused on the shower heads SWH. Accordingly, the gas may be uniformly distributed in the reaction area A located below the shower heads SWH so that process uniformity may be improved.

The gas inlet pipes GI may be made of (or include) a material that prevents corrosion, for example, a ceramic or quartz material, due to the gas applied to the etching process. The gas line GL may also be made of the same material as the gas inlet pipes GI.

The power supply unit PW may supply power to at least one of the plasma generation modules RPA, the stage ST, and the gas distribution unit GD. Although not shown in the drawing, the etching device 10 may further include a control unit configured to control the operation of at least one of the plasma generation modules RPA, the stage ST, the gas distribution unit GD, and the power supply unit PW. The operation of the power supply unit PW may be controlled by the control unit. For example, the control unit may control the power supply unit PW to turn on or off the supply of power to the plasma generation modules RPA, the stage ST, and the gas distribution unit GD.

The etching device 10 may be selectively switched to a first operation mode in which the plasma generation modules RPA are turned off or a second operation mode in which the plasma generation modules RPA are turned on. In more detail, in the first operation mode, gas in a gaseous state supplied from the gas supply unit GSP may pass through the plasma generation modules RPA and may be introduced into the chamber CM as it is, and in the second operation mode, the plasma generation modules RPA may be turned on, and the gas in a gaseous state supplied from the gas supply unit GSP may be excited to a plasma state by the plasma generation modules RPA and introduced into the chamber CM. Further, the etching device 10 may be switched to a third operation mode in which only some of the plasma generation modules RPA are turned on or off. Accordingly, the etching device 10 may selectively operate by a remote plasma method in which plasma is supplied from the outside of the chamber CM, by a direct method in which plasma is generated in the chamber CM, or by a hybrid method in which both are mixed. Switching between the operation modes described above may be controlled by the control unit.

With further reference to FIG. 5, the plasma generation modules RPA may be disposed on an upper surface CM_US of the chamber CM to be spaced apart from each other. For the sake of description, hereinafter, edges ED of the chamber CM located at the upper and lower sides of FIG. 5 and extending in a first direction X are referred to as a first edge ED1 and a second edge ED2, respectively, and edges ED of the chamber CM located on the left and right sides of FIG. 5 and extending in a second direction Y are referred to as a third edge ED3 and a fourth edge ED4, respectively. Although the upper surface CM_US of the chamber CM is illustrated in FIG. 5 as having a rectangular shape in a plan view, the shape of the upper surface CM_US of the chamber CM is not limited thereto. Although not shown, the edges ED of the chamber CM may substantially identical or similar to the edges of the gas diffusion unit GD.

As shown in FIG. 5, the plasma generation modules RPA may be arranged in the first direction X, but the disclosure is not limited thereto. The plasma generation modules RPA may be arranged in the second direction Y and may be arranged in a diagonal direction.

A portion of the plasma generation modules RPA may be located in a center of the chamber CM or an area adjacent to the center in a plan view, and another portion of the plasma generation modules RPA may be located at the edges ED and/or an area adjacent to the edge of the chamber CM.

The plasma generation modules RPA may include a first plasma generation module RPA1 disposed to be spaced apart from the edge ED of the upper surface CM_US of the chamber CM by a first distance D1 in a plan view, and a second plasma generation module RPA2 disposed to be spaced apart from the edge ED of the chamber CM by a second distance D2 in a plan view. The second distance D2 may be less than the first distance D1. Accordingly, the second plasma generation module RPA2 may be located between the first plasma generation module RPA1 and the edge ED of the chamber CM.

The first distance D1 and the second distance D2 may be distances measured on the basis of a center of each plasma generation module RPA, but the disclosure is not limited thereto. The first distance D1 and the second distance D2 may be distances measured on the basis of the edge of the plasma generation module RPA.

As shown in FIG. 5, one first plasma generation module RPA1 may be located at the center of the upper surface CM_US of the chamber CM, and two second plasma generation modules RPA2 may be disposed to be adjacent to the third edge ED3 and the fourth edge ED4 of the chamber CM with the first plasma generation module RPA1 therebetween.

The first plasma generation module RPA1 may be spaced apart from the first edge ED1 by a fourth distance D4 and may be spaced apart from the third edge ED3 by the first distance D1. The first distance D1 and the fourth distance D4 may be the same or different. In this case, the first plasma generation module RPA1 may be spaced apart from the second edge ED2 by the fourth distance D4 and may be spaced apart from the fourth edge ED4 by the first distance D1. For example, the first plasma generation module RPA1 may be disposed at the center of the upper surface CM_US of the chamber CM in a plan view, but the disclosure is not limited thereto.

Two second plasma generation modules RPA2 may be spaced apart from the third edge ED3 and the fourth edge ED4 by the second distance D2. In this case, the two second plasma generation modules RPA2 may be spaced apart from the first edge ED1 and/or the second edge ED2 by the fourth distance D4.

The first plasma generation module RPA1 and the second plasma generation module RPA2 may be spaced apart from each other by a third distance D3. The third distance D3 may be determined, for example, depending on the size of the chamber CM, the area of the upper surface of the chamber CM, the required amount of plasma, or the like.

The third distance D3 may be determined depending on a diffusion distance of the gas per unit time. In an embodiment, the third distance D3 may be determined by a diffusion distance of the gas during a first time. For example, the third distance D3 may be less than or equal to twice the diffusion distance of the gas during the first time. In this case, during the first time, gas discharged from the gas inlet pipe GI, which is connected to the first plasma generation module RPA1 and is diffused on the shower head SWH, may meet gas discharged from the gas inlet pipe GI, which is connected to the second plasma generation module RPA2 and diffused on the shower head SWH. For example, gas may be uniformly diffused on the shower heads SWH.

The first time may be a time during which gas converted into a plasma state by the plasma generation modules RPA is maintained in the plasma state in the chamber CM. For example, the first time may be a lifetime of the plasma in the chamber CM.

The first time may be a time during which an environment in the chamber CM is optimized to be suitable for the etching process after the target substrate T is transferred into the chamber CM and before etching is performed. For example, the first time may be a time from when the target substrate T is transferred into the chamber CM until the power supply unit PW supplies power to at least one of the plasma generation modules RPA, the stage ST, and the gas distribution unit GD. The first time may be measured on the basis of a time point at which the target substrate T is loaded onto the stage ST. In another example, the first time may be a time from after the target substrate T is loaded onto the stage ST until the electrostatic chuck provided on the stage ST is turned on.

In FIG. 5, three plasma generation modules RPA are illustrated, but the number of plasma generation modules RPA is not limited thereto and may vary depending on the size of the chamber CM, the area of the upper surface of the chamber CM, the required amount of plasma, or the like.

Figure 6:
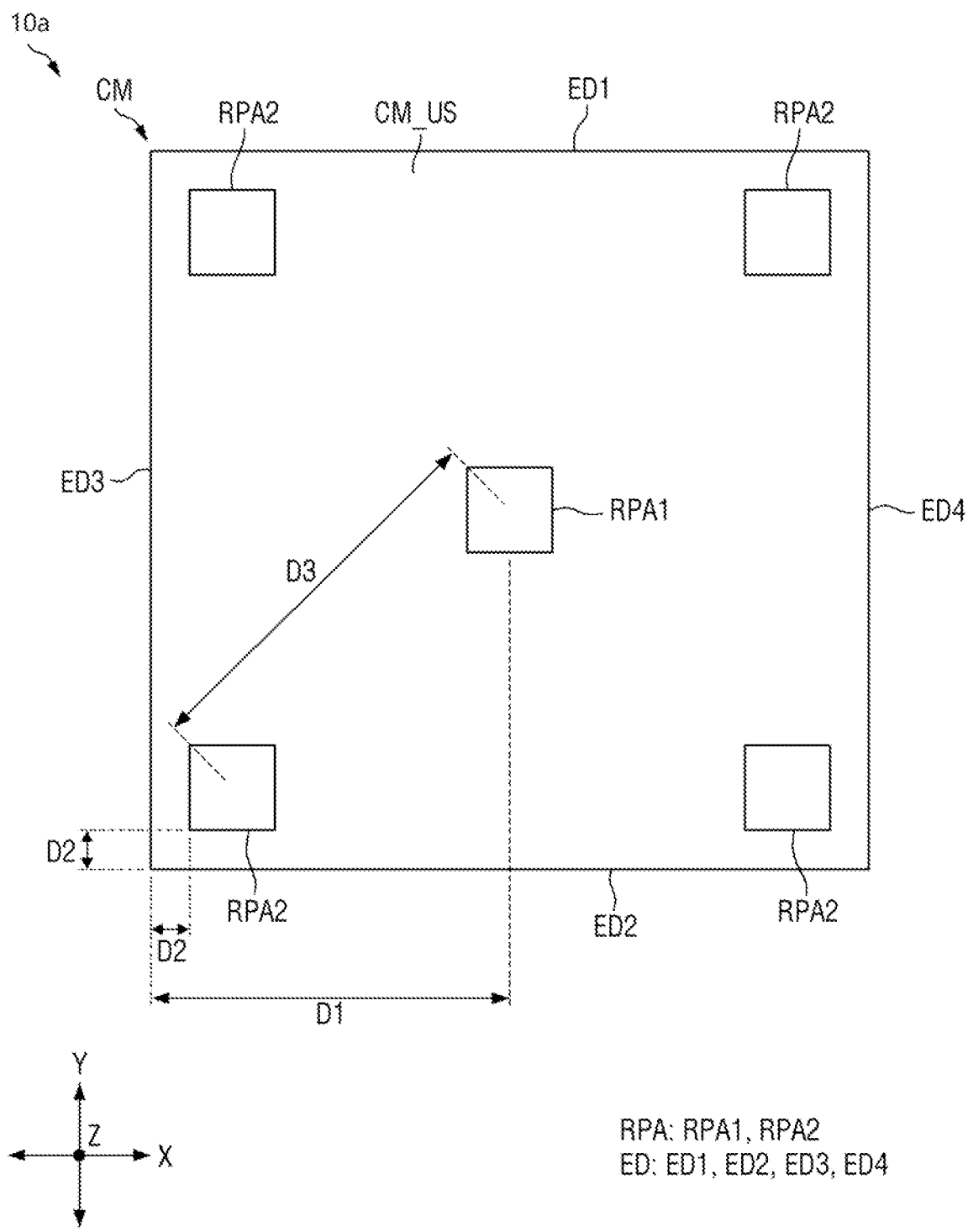
FIG. 6 is a schematic plan view illustrating an arrangement of plasma generation modules of an etching device according to another embodiment.

FIG. 6 is a schematic plan view illustrating an arrangement of plasma generation modules of an etching device 10a according to another embodiment.

The embodiment of FIG. 6 may be different from the embodiment of FIG. 5 at least in that plasma generation modules RPA are further disposed in corner areas of an upper surface of a chamber CM.

Referring to FIG. 6, a first plasma generation module RPA1 may be disposed at a center of an upper surface CM_US of the chamber CM in a plan view. The first plasma generation module RPA1 may be spaced apart from a first edge ED1, a second edge ED2, a third edge ED3, and a fourth edge ED4 by a first distance D1.

Second plasma generation modules RPA2 may be disposed to be adjacent to the edges ED of the upper surface CM_US of the chamber CM in a plan view and to be adjacent to corners of the upper surface CM_US of the chamber CM, respectively. The second plasma generation modules RPA2 may be located between the first plasma generation module RPA1 and the edges ED of the upper surface CM_US of the chamber CM.

As shown in FIG. 6, four second plasma generation modules RPA2 may be disposed in four corners of the upper surface CM_US of the chamber CM and/or in areas adjacent to the four corners, respectively. In this case, each of the second plasma generation modules RPA2 may be spaced apart from the edge ED adjacent thereto by the same distance. For example, the second plasma generation module RPA2 disposed at the left lower end of FIG. 6 may be disposed to be spaced apart from each of the third edge ED3 and the second edge ED2 by a second distance D2. Similarly, the second plasma generation module RPA2 disposed at the left upper end of FIG. 6 may be disposed to be spaced apart from each of the third edge ED3 and the first edge ED1 by the second distance D2. The second plasma generation module RPA2 disposed at the right upper end of FIG. 6 may be spaced apart from each of the first edge ED1 and the fourth edge ED4 by the second distance D2, and the second plasma generation module RPA2 disposed at the right lower end of FIG. 6 may be spaced apart from each of the second edge ED2 and the fourth edge ED4 by the second distance D2.

In FIG. 6, five plasma generation modules may be symmetrically arranged with respect to the center of the upper surface CM_US of the chamber CM, but the plasma generation modules RPA may be asymmetrically arranged.

The embodiment of FIG. 6 may be substantially identical or similar to the embodiment of FIG. 5 except that the plasma generation modules RPA are further disposed in the corner areas of the upper surface of the chamber CM, and thus in the following, repetitive descriptions thereof will be omitted.

Figure 7:
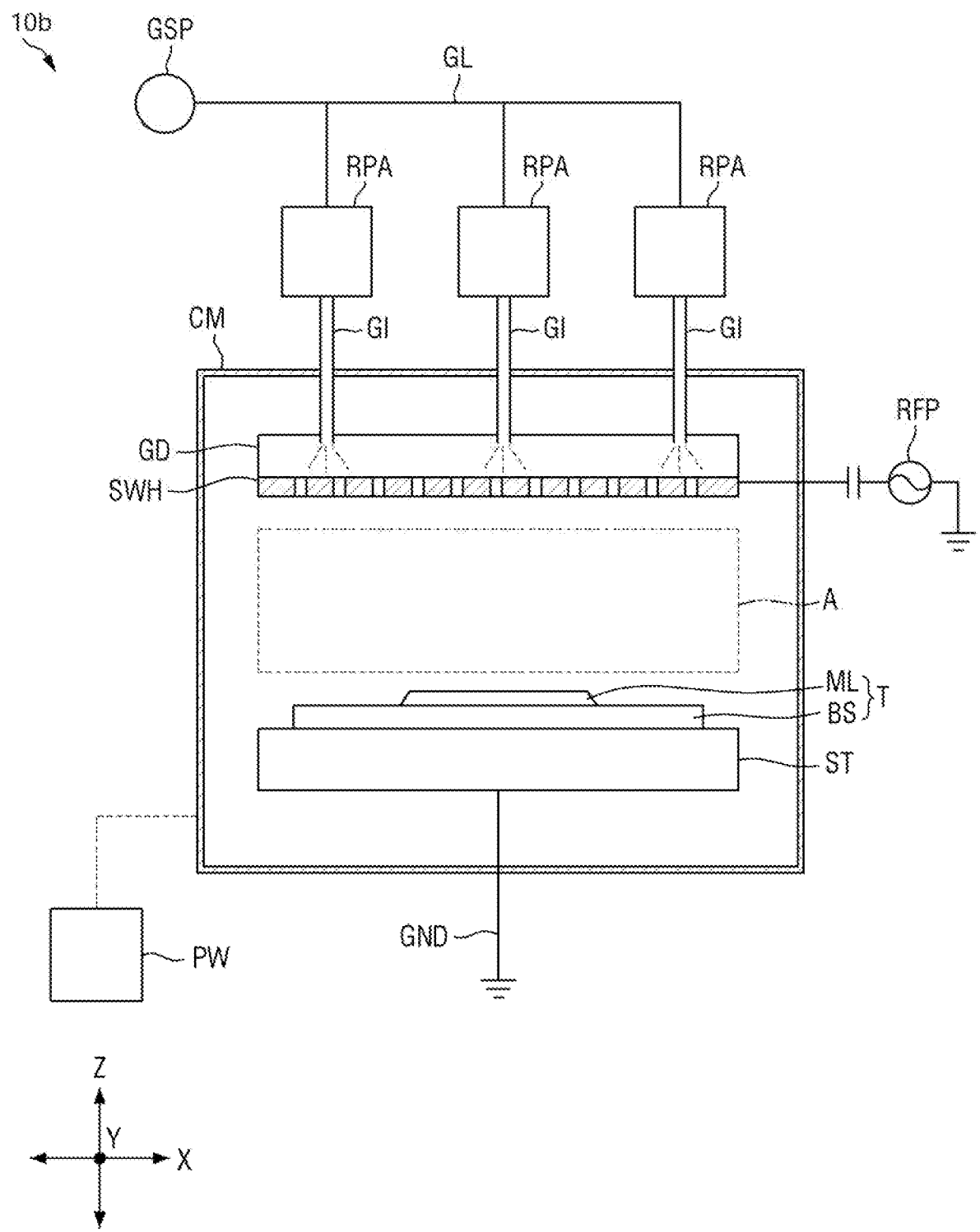
FIG. 7 is a schematic cross-sectional view of an etching device according to still another embodiment.

FIG. 7 is a schematic cross-sectional view of an etching device according to still another embodiment.

The embodiment of FIG. 7 may be different from the embodiment of FIG. 5 at least in that a radio frequency (RF) power supply RFP is connected to a gas distribution unit GD.

Referring to FIG. 7, a power supply unit PW may include the RF power supply RFP connected to the gas distribution unit GD.

The RF power supply RFP may be electrically connected to the gas distribution unit GD and may supply high-frequency power to the gas distribution unit GD. The RF power supply RFP may supply energy for exciting gas passing through the gas distribution unit GD to a plasma state. For example, the gas distribution unit GD, for example, a shower head SWH, may function as an electrode for forming plasma.

A ground electrode GND may be connected to a stage ST and electrically ground the stage ST. The stage ST may function as an electrode for forming plasma together with the gas distribution unit GD.

As described above, an etching device 10b may operate in a first operation mode or a second operation mode. Gas passing through the gas distribution unit GD may be in a gaseous state, may be in a plasma state, and/or may be in a state in which gas in the gaseous state and gas in the plasma state are mixed.

In case that plasma generation modules RPA are turned off, the etching device 10b may operate in a direct method in which gas is excited to a plasma state in a chamber CM.

For example, the etching device 10b may operate in a plasma etching (PE) mode. In case that at least some of the plasma generation modules RPA are turned on, the etching device 10b may operate in a remote method and/or in a hybrid method. In this case, the RF power supply RFP may be turned off. In case that at least some of the plasma generation modules RPA are turned on, a lifetime of the plasma may be extended, and this may help the gas in a plasma state to diffuse.

The embodiment of FIG. 7 may be substantially identical or similar to the embodiment of FIG. 5 except that the RF power supply RFP is connected to the gas distribution unit GD, and thus in the following, repetitive descriptions thereof will be omitted.

Figure 8:
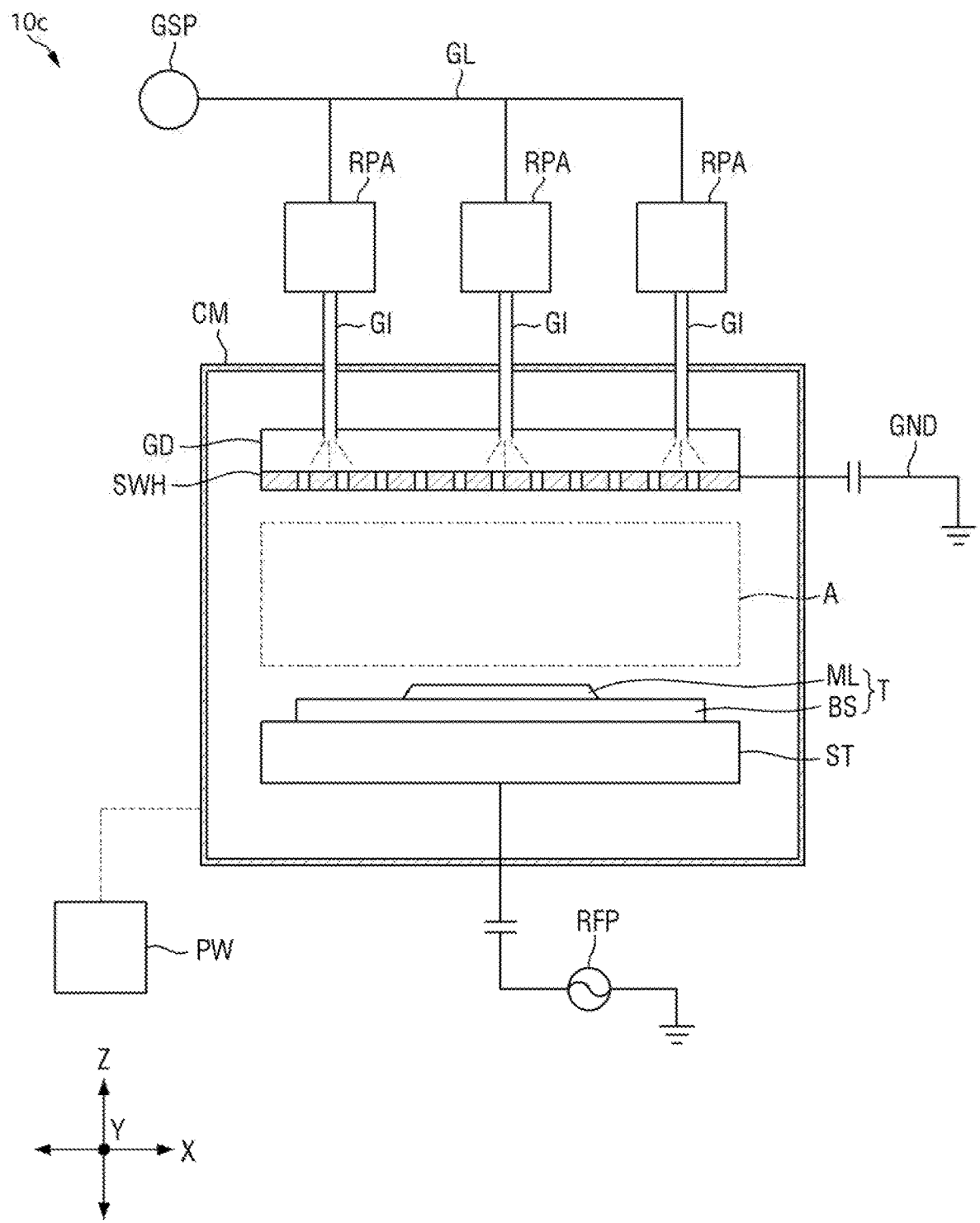
FIG. 8 is a schematic cross-sectional view of an etching device according to yet another embodiment.

FIG. 8 is a schematic cross-sectional view of an etching device according to yet another embodiment.

The embodiment of FIG. 8 may be different from the embodiment of FIG. 7 at least in that an RF power supply RFP is connected to a stage ST.

Referring to FIG. 8, a power supply unit PW may include the RF power supply RFP, and the RF power supply RFP may be electrically connected to the stage ST. The RF power supply RFP may supply high-frequency power to the stage ST. The RF power supply RFP may supply energy for exciting gas diffused on the stage ST to a plasma state. The stage ST may function as an electrode for forming plasma.

A ground electrode GND may be connected to a gas distribution unit GD and electrically ground the gas distribution unit GD. The gas distribution unit GD may function as an electrode for forming plasma together with the stage ST.

In case that plasma generation modules RPA are turned off, an etching device 10c may operate in a direct method in which gas is excited to a plasma state in a chamber CM. For example, the etching device 10 may operate in a reactive ion etching (RIE) mode. In case that at least some of the plasma generation modules RPA are turned on, the etching device 10c may operate in a remote method and/or in a hybrid method.

The embodiment of FIG. 8 may be substantially identical or similar to the embodiment of FIG. 7 except that the RF power supply RFP is connected to the stage ST, and thus in the following, repetitive descriptions thereof will be omitted.

Figure 9:
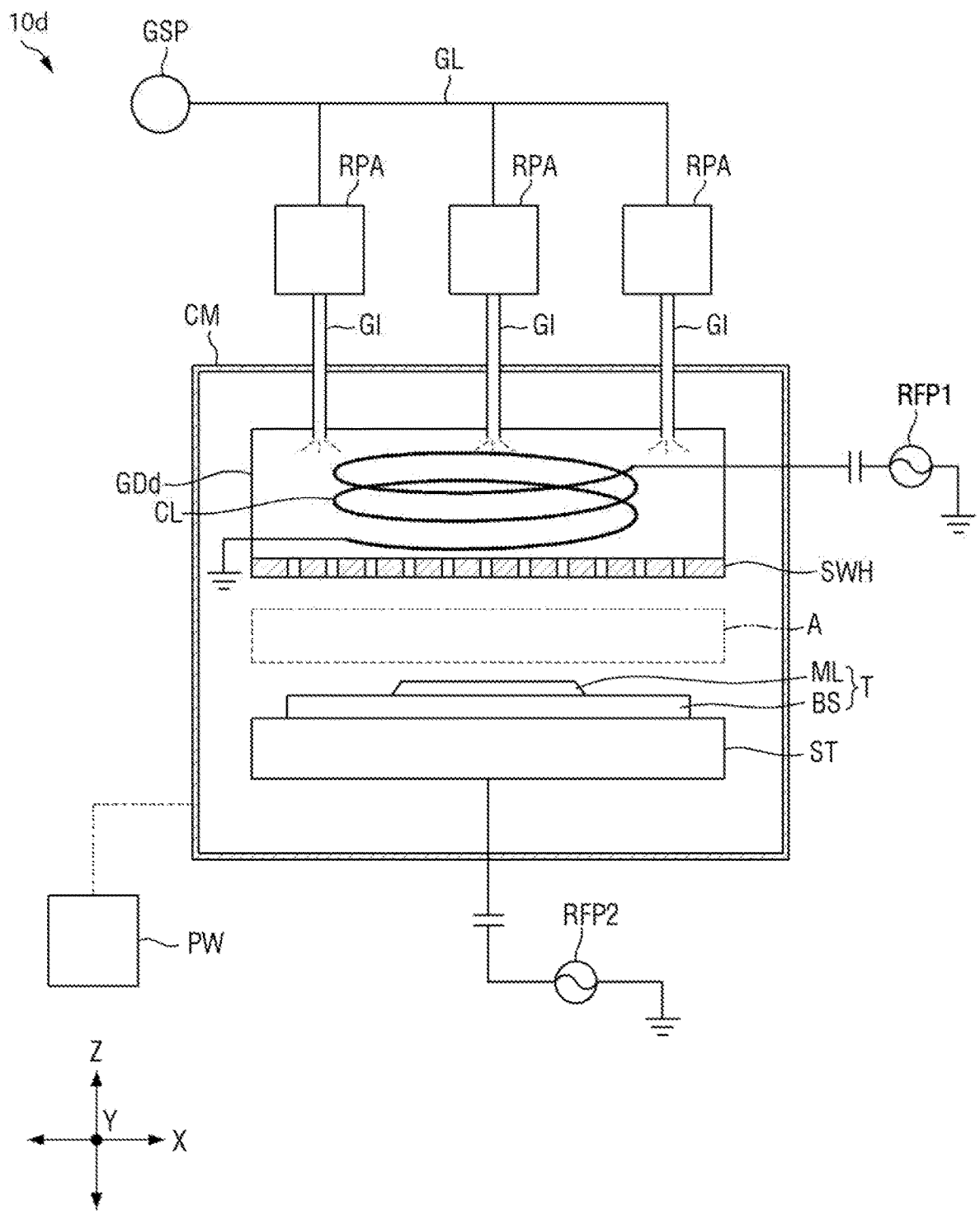
FIG. 9 is a schematic cross-sectional view of an etching device according to still yet another embodiment.

FIG. 9 is a schematic cross-sectional view of an etching device according to still yet another embodiment.

The embodiment of FIG. 9 may be different from the embodiment of FIG. 5 at least in that an induction coil CL is further disposed in a chamber CM.

Referring to FIG. 9, the induction coil CL for exciting gas may be further disposed in the chamber CM. The induction coil CL may be disposed on a path through which gas is introduced. The induction coil CL may be disposed below the other ends of gas inlet pipes GI. In this case, the induction coil CL may be disposed on shower heads SWH of a gas distribution unit GDd, but the position of the induction coil CL is not limited thereto. In some embodiments, induction coils CL may be disposed in the chamber CM. In some embodiments, the induction coils CL may be disposed on the gas inlet pipes GI. For example, the induction coils CL may be disposed on the gas inlet pipes GI, respectively.

A power supply unit PW may include a first RF power supply RFP1 electrically connected to the induction coil CL and a second RF power supply RFP2 electrically connected to a stage ST.

The first RF power supply RFP1 and the second RF power supply RFP2 may supply high-frequency power to the induction coil CL and the stage ST, respectively. The first RF power supply RFP1 and the second RF power supply RFP2 may supply energy for exciting gas diffused on the stage ST to a plasma state. The induction coil CL and the stage ST may each function as an electrode for forming plasma. The first RF power supply RFP1 and the second RF power supply RFP2 may be simultaneously turned on or off. The first RF power supply RFP1 and/or the second RF power supply may be turned on or off.

As described above, an etching device 10d may operate in a first operation mode or a second operation mode. Gas passing through the gas distribution unit GDd may be in a gaseous state, may be in a plasma state, and/or may be in a state in which gas in the gaseous state and gas in the plasma state are mixed.

In case that plasma generation modules RPA are turned off, the etching device 10d may operate in a direct method in which gas is excited to a plasma state in the chamber CM. For example, the etching device 10d may operate in an inductively coupled plasma (ICP) mode. In case that at least some of the plasma generation modules RPA are turned on, the etching device 10d may operate in a remote method and/or in a hybrid method. In this case, at least one of the first RF power supply RFP1 and the second RF power supply RFP2 may be turned off.

The embodiment of FIG. 9 may be substantially identical or similar to the embodiment of FIG. 5 except that the induction coil CL is further disposed in the chamber CM, and thus in the following, repetitive descriptions thereof will be omitted.

Figure 10:
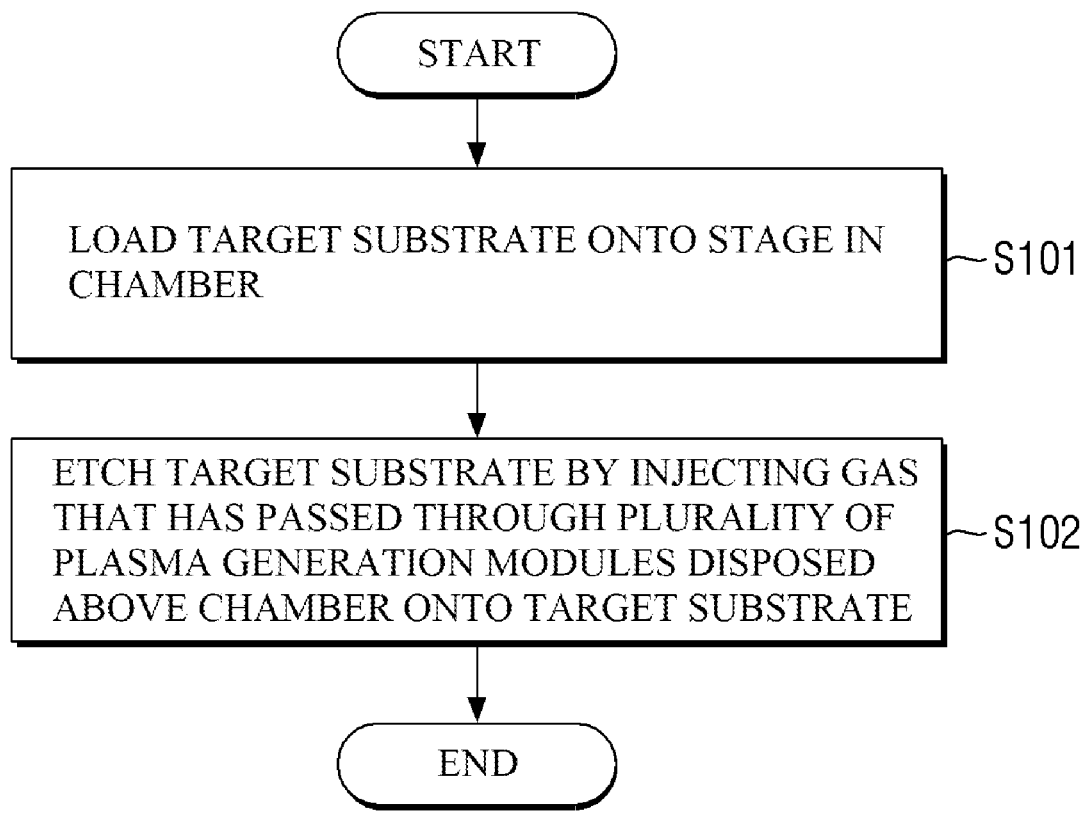
FIG. 10 is a schematic flowchart illustrating a method of manufacturing a display device according to an embodiment.
Figure 11:
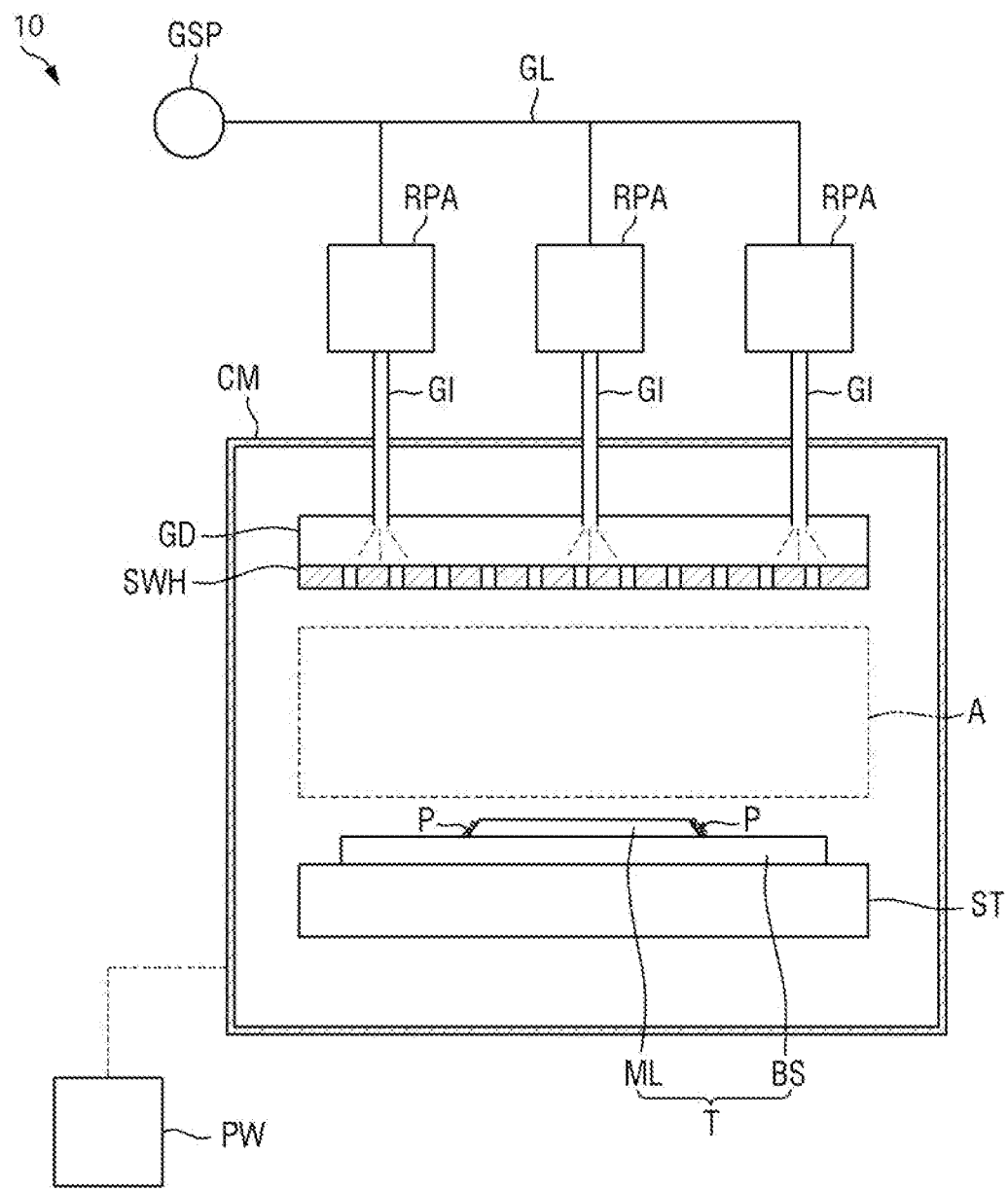
FIGS. 11 and 12 are schematic diagrams illustrating operations of the method of manufacturing a display device according to an embodiment.
Figure 12:
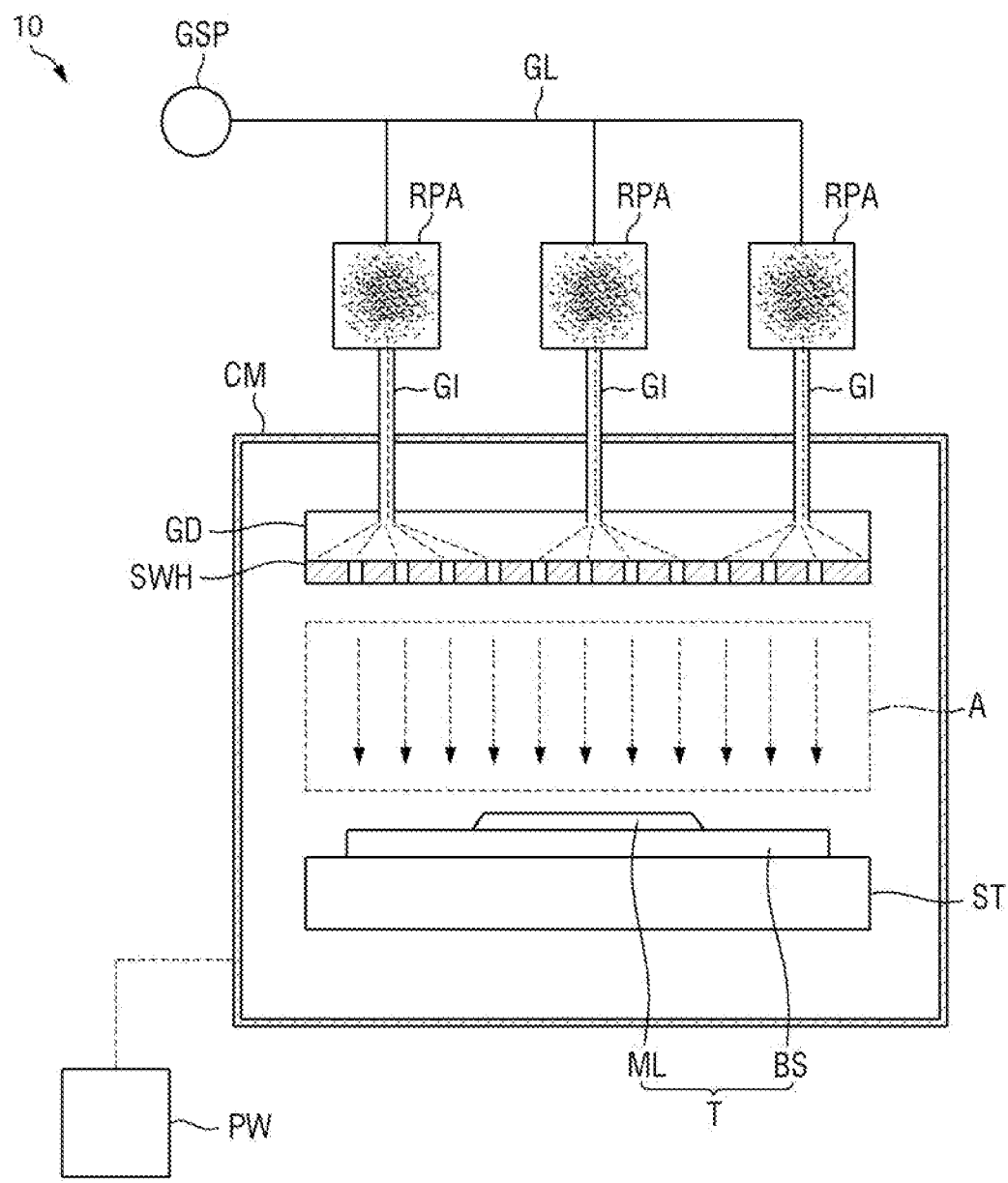

FIG. 10 is a flowchart schematically illustrating a method of manufacturing a display device according to an embodiment. FIGS. 11 and 12 are schematic diagrams illustrating operations of the method of manufacturing a display device according to an embodiment.

A display device manufactured by the following methods of manufacturing a display device may be the display device of FIGS. 1 to 3, but the disclosure is not limited thereto.

Referring to FIG. 10, the method of manufacturing a display device according to an embodiment may include loading (S101) a target substrate T onto a stage ST in a chamber CM and injecting or spraying gas, which has passed through plasma generation modules RPA disposed above the chamber CM, onto the target substrate T to etch the target substrate T (S102).

The method of manufacturing a display device may further include diffusing the gas by spraying the gas onto a center portion of a gas distribution unit GD disposed above the stage ST and a space between the center portion of the gas distribution unit GD and an edge of the gas distribution unit GD.

The method of manufacturing a display device may further include switching the operation mode of the etching device to a first operation mode in which the plasma generation modules RPA are turned off and gas in a gaseous state introduced from the outside is excited to a plasma state in the chamber CM, or a second operation mode in which the plasma generation modules RPA are turned on to excite gas in a gaseous state passing through the plasma generation modules RPA to a plasma state.

The method of manufacturing a display device is not limited to the above example, and at least some of the operations may be omitted, or at least one or more other operations described below with reference to FIGS. 1 to 9 and 11 to 13 may be added.

Hereinafter, the method of manufacturing a display device will be described in detail with further reference to FIGS. 11 and 12.

Referring to FIG. 11, the target substrate T may be transferred into the chamber CM. As described above, the target substrate T may include a base layer BS and a metal layer ML. The target substrate T may be in a state in which impurities P, for example, corrosion, are formed on the metal layer ML. The metal layer ML may include aluminum, and the impurities P may be aluminum oxide.

After the target substrate T is transferred, an etching device 10 may be optimized to have an environment suitable for an etching process. The optimization may be performed for a first time. As described above, the first time may be a time from after the target substrate T is transferred until a power supply unit PW supplies power to at least one of the stage ST, a gas distribution unit GD, and the plasma generation modules RPA. During the first time, the gas may be introduced into the chamber CM and diffused. The first time may mean a time sufficient to uniformly diffuse the gas on shower heads SWH.

Referring to FIG. 12, after the optimization of the etching device 10 is completed, gas in a gaseous state may be supplied to the plasma generation modules RPA from the gas supply unit GSP. The plasma generation modules RPA may be turned on to excite the gas passing through the plasma generation modules RPA to a plasma state. In this case, the etching device 10 may operate in the second operation mode. The second operation mode may mean a remote method. For example, plasma for etching may be generated outside the chamber CM and introduced into the chamber CM. Although not shown in the drawing, the power supply unit PW may be connected to at least one of the gas distribution unit GD and the stage ST. In this case, the etching device 10 may operate in the first operation mode or a third operation mode in which the first operation mode and the second operation mode are mixed.

The gas in a plasma state may be introduced into the chamber CM through gas inlet pipes GI. The gas inlet pipes GI may be disposed at predetermined intervals above the shower heads SWH so that the gas may be uniformly diffused on the shower heads SWH. Subsequently, the gas in the plasma state may pass through the shower head SWH and may be uniformly distributed into a reaction area A. The gas in the plasma state diffused in the reaction area A may remove the impurities P on the metal layer ML by etching.

With further reference to FIGS. 1 to 3, the base layer BS and the metal layer ML of the target substrate T may correspond to the first substrate SUB1 and the gate electrode GE, respectively.

The buffer layer 102, the semiconductor layer 105, the first insulating layer 111, and the gate electrode GE may be sequentially formed on the first substrate SUB1 before the target substrate T is loaded. Next, the impurities P of the gate electrode GE may be plasma etched. After the gate electrode GE is etched, the remaining layers forming (or constituting) the display panel, for example, the second insulating layer 112a, the second conductive layer 130, the third insulating layer 113, the third conductive layer 140, the first via layer VIA1, the fourth conductive layer 150, or the like may be sequentially formed on the gate electrode GE.

Figure 13:
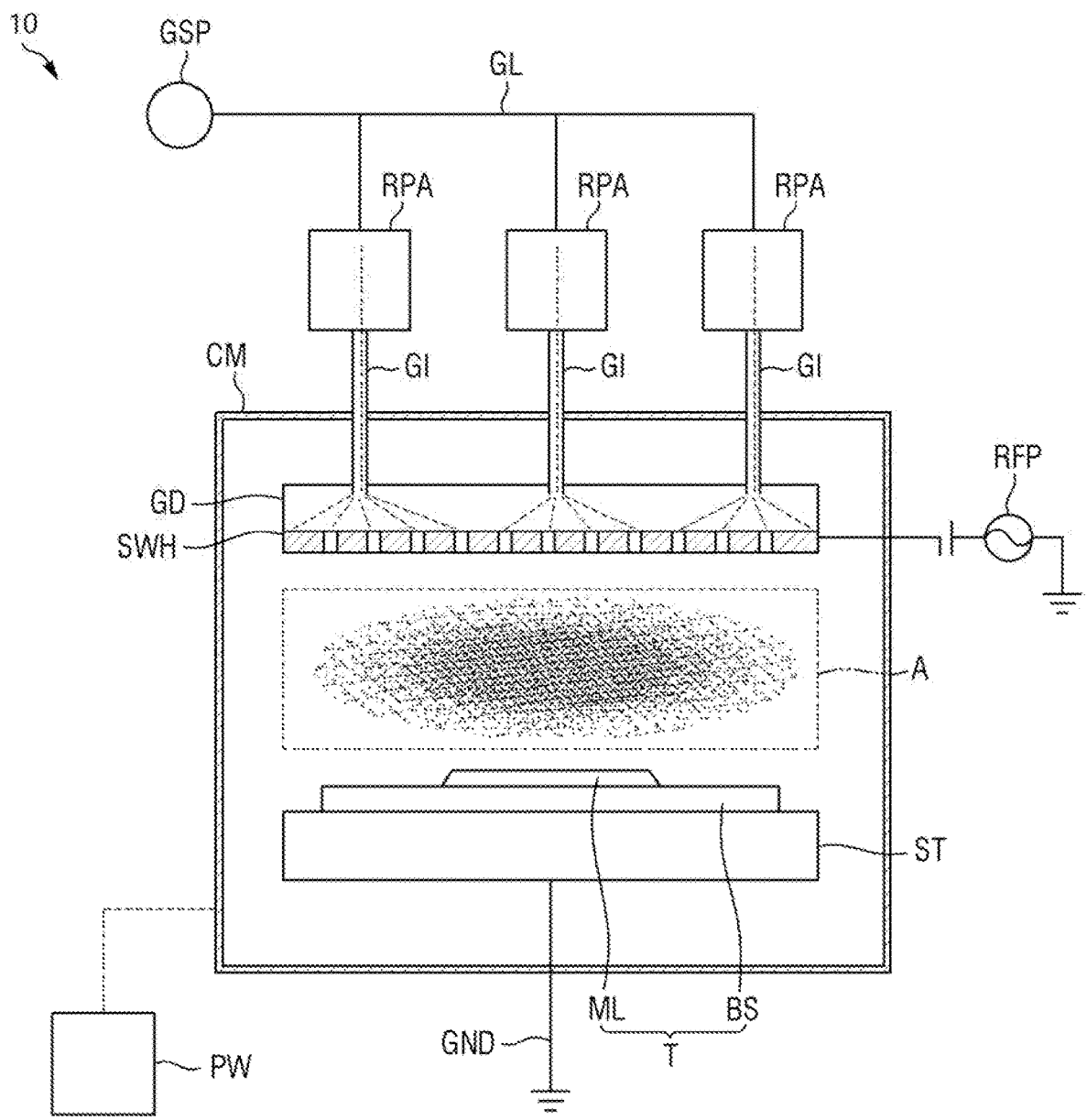
FIG. 13 is a schematic diagram illustrating a method of manufacturing a display device according to another embodiment.

FIG. 13 is a schematic view illustrating a method of manufacturing a display device according to another embodiment.

The embodiment of FIG. 13 may be different from the embodiment of FIG. 12 in that plasma for etching is generated inside a chamber CM.

Referring to FIG. 13, after the optimization of an etching device 10 is completed, gas in a gaseous state may be supplied to plasma generation modules RPA from a gas supply unit GSP. In this case, the plasma generation modules RPA may be turned off so that the gas in a gaseous state may pass therethrough without being excited to a plasma state. For example, the etching device 10 may operate in a first operation mode. The first operation mode may refer to a direct method in which plasma is generated inside the chamber CM.

After the optimization of the etching device 10 is completed, power may be supplied to a stage ST by a RF power supply RFP. The gas in the gaseous state may be discharged from gas inlet pipes GI and be diffused on shower heads SWH. Then, the gas in the gaseous state may be excited to a plasma state while passing through the shower heads SWH. Although not shown in the drawing, the gas in the gaseous state may be excited to the plasma state by the stage ST to which the RF power supply RFP is connected or may be excited by an induction coil CL disposed above the stage ST.

The gas in the plasma state may be distributed in a reaction area A. The gas in the plasma state diffused in the reaction area A may remove impurities P on a metal layer ML by etching.

According to an etching device and a method of manufacturing a display device by using the same according to an embodiment, corrosion formed on a target substrate may be removed, and reaction uniformity may be increased.

Effects according to the embodiments are not limited by the disclosure, and more various effects are included in the disclosure.

In concluding the detailed description, those skilled in the art will appreciate that many variations and modifications can be made to the embodiments without substantially departing from the principles of the disclosure. Therefore, the disclosed preferred embodiments of the disclosure are used in a generic and descriptive sense only and not for purposes of limitation.

What is claimed is:

1. An etching device comprising:
   a chamber;
   a stage disposed in the chamber and on which a target substrate is loaded;
   a gas distribution unit disposed to face the stage in the chamber;
   a plurality of plasma generation modules disposed above the chamber;
   a gas supply unit that supplies gas into the chamber;
   a gas line connecting the gas supply unit and the plurality of plasma generation modules; and
   a plurality of gas inlet pipes each including an end connected to the plasma generation module and another end connected to the gas distribution unit, wherein
   the plurality of plasma generation modules include:
      a first plasma generation module spaced apart from an edge of an upper surface of the chamber by a first distance in a plan view; and
      a plurality of second plasma generation modules spaced apart from the edge of the upper surface of the chamber by a second distance in a plan view, and
      the second distance is less than the first distance.

2. The etching device of claim 1, wherein the first plasma generation module is disposed in a center of the upper surface of the chamber in a plan view.

3. The etching device of claim 1, wherein the first plasma generation module and the plurality of second plasma generation modules are arranged in a first direction on the upper surface of the chamber.

4. The etching device of claim 1, wherein the plurality of second plasma generation modules are disposed at corner areas of the upper surface of the chamber, respectively.

5. The etching device of claim 1, wherein the etching device is selectively switched to a first operation mode in which the plurality of plasma generation modules are turned off or a second operation mode in which the plurality of plasma generation modules are turned on.

6. An etching device comprising:
   a chamber;
   a stage disposed in the chamber and on which a target substrate is loaded;
   a gas distribution unit disposed to face the stage in the chamber;
   a plurality of plasma generation modules disposed above the chamber;
   a gas supply unit that supplies gas into the chamber;
   a gas line connecting the gas supply unit and the plurality of plasma generation modules; and
   a plurality of gas inlet pipes each including an end connected to the plasma generation module and another end connected to the gas distribution unit, wherein
   the etching device is selectively switched to a first operation mode in which the plurality of plasma generation modules is turned off or a second operation mode in which the plurality of plasma generation modules is turned on,
   in the first operation mode, the gas in a gaseous state supplied from the gas supply unit passes through the plurality of plasma generation modules and is introduced into the chamber as it is, and
   in the second operation mode, the plurality of plasma generation modules is turned on, and the gas in the gaseous state supplied from the gas supply unit is excited to a plasma state by the plurality of plasma generation modules and introduced into the chamber.

7. An etching device comprising:
   a chamber;
   a stage disposed in the chamber and on which a target substrate is loaded;
   a gas distribution unit disposed to face the stage in the chamber;
   a plurality of plasma generation modules disposed above the chamber;
   a gas supply unit that supplies gas into the chamber;
   a gas line connecting the gas supply unit and the plurality of plasma generation modules; and
   a plurality of gas inlet pipes each including an end connected to the plasma generation module and another end connected to the gas distribution unit, wherein
   the plurality of plasma generation modules is disposed on an upper surface of the chamber to be spaced apart from each other by a third distance, and
   the third distance is less than or equal to twice a diffusion distance of the gas during a first time in the chamber.

8. The etching device of claim 7, wherein the first time is a time during which the gas converted into a plasma state by the plurality of plasma generation modules is maintained in the plasma state in the chamber.

9. The etching device of claim 7, further comprising a power supply unit that supplies power to at least one of the plurality of plasma generation modules, the stage, and the gas distribution unit, wherein the first time is a time from when the target substrate is loaded on the stage until the power supply unit supplies the power.

10. The etching device of claim 9, wherein
the stage includes an electrostatic chuck, and
the electrostatic chuck is turned on after the first time has passed from when the target substrate is loaded on the electrostatic chuck.

11. The etching device of claim 9, wherein the power supply unit includes an RF (radio frequency) power supply that supplies energy to excite the gas passing through the gas distribution unit to a plasma state.

12. The etching device of claim 11, wherein the RF power supply is electrically connected to the stage.

13. The etching device of claim 11, wherein the RF power supply is electrically connected to the gas distribution unit.

14. The etching device of claim 13, wherein the gas distribution unit includes an induction coil.

15. The etching device claim 1, wherein
the target substrate includes a base layer and a metal layer disposed on the base layer,
impurities are disposed on the metal layer, and
the impurities are etched by the gas excited to a plasma state.

16. The etching device of claim 15, wherein
the metal layer includes aluminum, and
the impurities are aluminum oxide.

17. A method of manufacturing a display device, the method comprising:
loading a target substrate onto a stage in a chamber;
injecting gas, which has passed through a plurality of plasma generation modules disposed in an upper portion of the chamber, onto the target substrate to etch the target substrate; and
switching an operation mode of an etching device to a first operation mode in which the plurality of plasma generation modules are turned off and the gas in a gaseous state introduced from the outside is excited to a plasma state in the chamber, or a second operation mode in which the plurality of plasma generation modules are turned on to excite the gas in the gaseous state passing through the plurality of plasma generation modules to the plasma state.

18. The method of claim 17, further comprising diffusing the gas by injecting the gas into a center portion of a gas distribution unit disposed above the stage and a space between the center portion of the gas distribution unit and an edge of the gas distribution unit.

* * * * *